United States Patent
Kawaguchi et al.

(10) Patent No.: US 10,186,586 B1
(45) Date of Patent: Jan. 22, 2019

(54) SEMICONDUCTOR DEVICE AND METHOD FOR FORMING THE SEMICONDUCTOR DEVICE

(71) Applicant: Sanken Electric Co., Ltd., Niiza-shi, Saitama (JP)

(72) Inventors: Hiroko Kawaguchi, Niiza (JP); Hiroshi Shikauchi, Niiza (JP); Hiromichi Kumakura, Niiza (JP); Shinji Kudoh, Niiza (JP)

(73) Assignee: Sanken Electric Co., Ltd., Niiza-shi (JP)

(*) Notice: Subject to any disclaimer, the term of this patent is extended or adjusted under 35 U.S.C. 154(b) by 0 days.

(21) Appl. No.: 15/715,236

(22) Filed: Sep. 26, 2017

(51) Int. Cl.
*H01L 21/263* (2006.01)
*H01L 29/32* (2006.01)
*H01L 29/872* (2006.01)
*H01L 29/868* (2006.01)
*H01L 29/16* (2006.01)

(52) U.S. Cl.
CPC .......... *H01L 29/32* (2013.01); *H01L 29/1608* (2013.01); *H01L 29/868* (2013.01); *H01L 29/872* (2013.01)

(58) Field of Classification Search
CPC ... H01L 29/32; H01L 29/1608; H01L 29/872; H01L 29/868

USPC ......................................................... 257/617
See application file for complete search history.

(56) References Cited

U.S. PATENT DOCUMENTS

| | | | | |
|---|---|---|---|---|
| 9,385,217 | B2* | 7/2016 | Nakajima | H01L 29/0634 |
| 2008/0246096 | A1* | 10/2008 | Sakakibara | H01L 29/0634 257/401 |
| 2014/0302621 | A1* | 10/2014 | Niimura | H01L 21/263 438/14 |
| 2016/0315140 | A1* | 10/2016 | Iwasaki | H01L 29/32 |
| 2017/0012102 | A1 | 1/2017 | Konrath et al. | |

* cited by examiner

*Primary Examiner* — Marc Armand
*Assistant Examiner* — Sue Tang
(74) *Attorney, Agent, or Firm* — Harness, Dickey & Pierce, P.L.C.

(57) ABSTRACT

A semiconductor device and a method for forming the semiconductor device. The semiconductor device includes a first semiconductor region having a first conductivity type; and a second semiconductor region having a second conductivity type. The first semiconductor region is configured within the second semiconductor region and a plurality of crystal defects are formed in the second semiconductor region and at least part of the first semiconductor region is surrounded by the plurality of crystal defects. Therefore, recombination of charge carriers (electrons and holes) on a lateral direction and a longitudinal direction could be taken into account, and the switching time of the semiconductor device could be adequately decreased.

16 Claims, 3 Drawing Sheets

SEMICONDUCTOR DEVICE AND METHOD FOR FORMING THE SEMICONDUCTOR DEVICE

TECHNICAL FIELD

Embodiments of the present disclosure generally relate to the field of semiconductors, and more particularly, to a semiconductor device and a method for forming the semiconductor device.

BACKGROUND

A semiconductor device (or may be referred to as a semiconductor element, component, apparatus, and so on) may include a substrate, a semiconductor body and an electrode. For example, materials mainly used in the substrate and the semiconductor body may be silicon carbide (SiC). Furthermore, some regions may be configured within the semiconductor body.

FIG. 1 is a diagram which shows an example of a semiconductor device in the prior art. As shown in FIG. 1, a semiconductor device 100 may include a semiconductor body 101 and a substrate 102. The semiconductor body 101 may at least includes a first semiconductor region 1011 which has a first conductivity type (such as p-type, or may be referred to as p-doping) and a second semiconductor region 1012 which has a second conductivity type (such as n-type, or may be referred to as n-doping).

As shown in FIG. 1, a plurality of crystal defects 1013 may be formed within the second semiconductor region 1012 by introducing non-doping particles into the semiconductor body 101. The crystal defects 1013 may be referred to as zero-dimensional defects, as opposed to one-dimensional or two-dimensional defects such as, for example, stacking faults or basal plane dislocations.

Therefore, recombination of charge carriers (electrons and holes) may be occurred at those crystal defects 1013; in addition, those crystal defects 1013 may act as barriers that prevent other defects from expanding the semiconductor body 101. In this way, a degradation of the semiconductor device, such as an increased electrical resistance and enhanced leakage current of those semiconductor regions, may be prevented or at least reduced.

This section introduces aspects that may facilitate a better understanding of the disclosure. Accordingly, the statements of this section are to be read in this light and are not to be understood as admissions about what is in the prior art or what is not in the prior art.

SUMMARY

However, the inventor found that those crystal defects 1013 are formed in inner portions of the second semiconductor region 1012; and are configured under the first semiconductor region 1011. In this way, it is difficult to adequately decrease a switching time of the semiconductor device.

In order to solve at least part of the above problems, methods, apparatus, devices are provided in the present disclosure. Features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a semiconductor device and a method for forming the semiconductor device. It is expected to adequately decrease the switching time of the semiconductor device in this disclosure.

In a first aspect, a semiconductor device is provided. The semiconductor device includes: a first semiconductor region having a first conductivity type; and a second semiconductor region having a second conductivity type. The first semiconductor region is configured within the second semiconductor region and a plurality of crystal defects are formed in the second semiconductor region and at least part of the first semiconductor region is surrounded by the plurality of crystal defects.

In one embodiment, the first conductivity type is p-doping and the second conductivity type is n-doping; and a p-n junction is formed between the first semiconductor region and the second semiconductor region.

In one embodiment, the plurality of crystal defects are formed in one or more side portions and a lower portion of the second semiconductor region.

In one embodiment, the one or more side portions contact to one or more side surfaces of the first semiconductor region and the lower portion contacts to a lower surface of the first semiconductor region.

In one embodiment, a concentration of the crystal defects in the side portion is lower than the concentration of the crystal defects in the lower portion.

In one embodiment, a ratio of the concentration of the crystal defects in the side portion to the concentration of the crystal defects in the lower portion is from 1:2 to 1:6.

In one embodiment, the ratio of the concentration of the crystal defects in the side portion to the concentration of the crystal defects in the lower portion is 1:4.

In one embodiment, two or more first semiconductor regions are configured within the second semiconductor region; and a plurality of crystal defects are formed for each of the first semiconductor regions in the second semiconductor region and each of the first semiconductor regions is surrounded by the plurality of crystal defects.

In one embodiment, the semiconductor device may further include a substrate on which the second semiconductor region is configured.

In one embodiment, the semiconductor device may further include an electrode configured on the first semiconductor region and the second semiconductor region.

In a second aspect, a method for forming a semiconductor device is provided. The method includes providing a first semiconductor region which has a first conductivity type; providing a second semiconductor region which has a second conductivity type; and forming a plurality of crystal defects in the second semiconductor region. The first semiconductor region is configured within the second semiconductor region and at least part of the first semiconductor region is surrounded by the plurality of crystal defects.

In one embodiment, the method may further include providing a substrate on which the second semiconductor region is configured.

In one embodiment, the method may further include providing an electrode configured on the first semiconductor region and the second semiconductor region.

According to various embodiments of the present disclosure, a plurality of crystal defects may be formed in a second semiconductor region and at least part of a first semiconductor region is surrounded by the plurality of crystal defects.

Therefore, recombination of charge carriers (electrons and holes) on a lateral direction (for example in a side portion) and a longitudinal direction (for example in a lower portion) could be taken into account, and the switching time of the semiconductor device could be adequately decreased.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

It should be understood that when an element is referred to as being "connected" or "coupled" or "contacted" to another element, it may be directly connected or coupled or contacted to the other element or intervening elements may be present. In contrast, when an element is referred to as being "directly connected" or "directly coupled" or "directly contacted" to another element, there are no intervening elements present. Other words used to describe the relationship between elements should be interpreted in a like fashion (e.g., "between" versus "directly between", "adjacent" versus "directly adjacent", etc.).

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof.

The term "based on" is to be read as "based at least in part on". The term "cover" is to be read as "at least in part cover". The term "one embodiment" and "an embodiment" are to be read as "at least one embodiment". The term "another embodiment" is to be read as "at least one other embodiment". Other definitions, explicit and implicit, may be included below.

In this disclosure, unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A First Aspect of Embodiments

A semiconductor device is provided in those embodiments.

Figure 1:
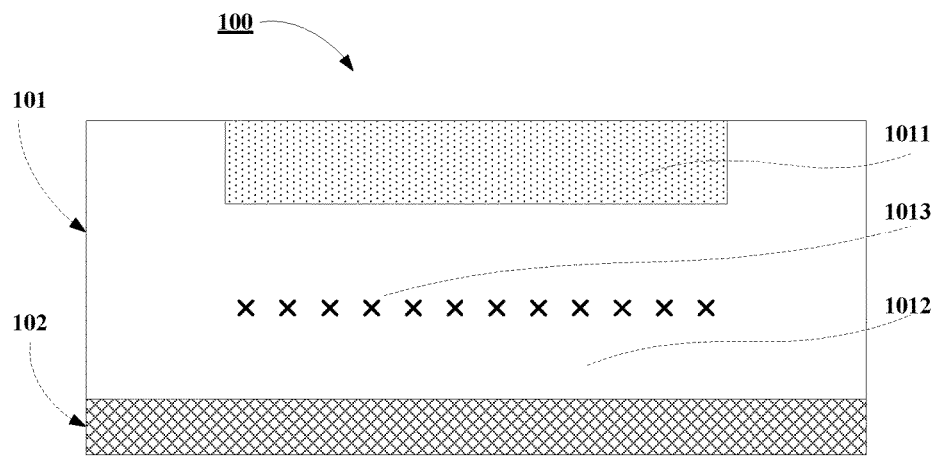
FIG. 1 is a diagram which shows an example of a semiconductor device in the prior art.
Figure 2:
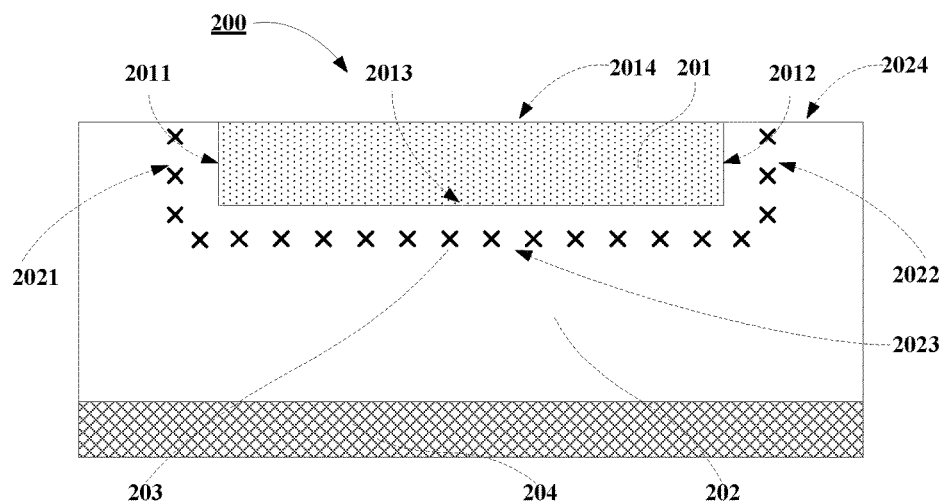
FIG. 2 is a diagram which shows a schematic illustration of a cross-section of a semiconductor device 200 in accordance with an embodiment of the present disclosure.

FIG. 2 is a diagram which shows a schematic illustration of a cross-section of a semiconductor device 200 in accordance with an embodiment of the present disclosure. As shown in FIG. 2, the semiconductor device 200 includes a first semiconductor region 201 which has a first conductivity type (such as p-type, or may be referred to as p-doping) and a second semiconductor region 202 which has a second conductivity type (such as n-type, or may be referred to as n-doping).

As shown in FIG. 2, the first semiconductor region 201 may be configured within the second semiconductor region 202. For example, a side surface 2011, another side surface 2012 and a lower surface 2013 of the first semiconductor region 201 may be buried in and contact to the second semiconductor region 202; and an upper surface 2014 of the first semiconductor region 201 may be aligned with an upper surface 2024 of the second semiconductor region 202.

Furthermore, a plurality of crystal defects 203 are formed in the second semiconductor region 202 and at least part of the first semiconductor region 201 is surrounded by the plurality of crystal defects 203.

For example, the plurality of crystal defects 203 are formed in a side portion 2021, another side portion 2022 and a lower portion 2023 of the second semiconductor region 202. The side portion 2021 contacts to the side surface 2011 of the first semiconductor region 201, the side portion 2022 contacts to the side surface 2012 of the first semiconductor region 201 and the lower portion 2023 contacts to the lower surface 2013 of the first semiconductor region 201.

As shown in FIG. 2, the semiconductor device 200 may further include a substrate 204 on which the second semiconductor region 202 is configured.

In an embodiment, the crystal defects 203 may include point defects or complexes with several point defects. Examples of the complexes with several point defects may include, for example, double-voids or complexes with several voids and at least one additional impurity atom such as, for example, nitrogen, oxygen or vanadium.

In addition, those crystal defects 203 may be referred to as zero-dimensional crystal defects, as opposed to one-dimensional or two-dimensional defects such as, for example, stacking faults or basal plane dislocations.

In an embodiment, the crystal defects 203 may be formed by introducing non-doping particles into the semiconductor body. The particles may include such as, protons, noble gas ions, group-IV ions, heavy metal ions; and it is not limited thereto.

Therefore, a degradation of the semiconductor device, such as an increased electrical resistance and enhanced leakage current of those semiconductor regions, may be prevented or at least reduced. Furthermore, recombination of charge carriers (electrons and holes) on a lateral direction (for example in the side portions 2021 and 2022) and a longitudinal direction (for example in the lower portion 2023) could be taken into account, accumulation of the holes may be reduced and the switching time of the semiconductor device could be adequately decreased.

In an embodiment, the first conductivity type may be p-doping and the second conductivity type may be n-doping; and a p-n junction may be formed between the first semiconductor region and the second semiconductor region. However, it is not limited thereto in this disclosure.

It should be appreciated that silicon or another material may be mainly used in the semiconductor device. For example, silicon carbide may be used in the first semiconductor region 201 and/or the second semiconductor region 202 and/or the substrate 204. However, it is not limited thereto, for example, semiconductor materials with a larger band gap may also be used. Next, silicon carbide may be used as an example of a material of the semiconductor device.

Furthermore, the semiconductor device may be one of the following apparatus or some components of the apparatus, e.g., Schottky diode, p-n diode, bipolar transistor, field effect transistor, metal oxide semiconductor transistor or junction gate field effect transistor. However, it is not limited thereto in this disclosure.

In an embodiment, a concentration (or may be referred to as density) of the crystal defects in the side portion may be lower than the concentration of the crystal defects in the lower portion.

Figure 3:
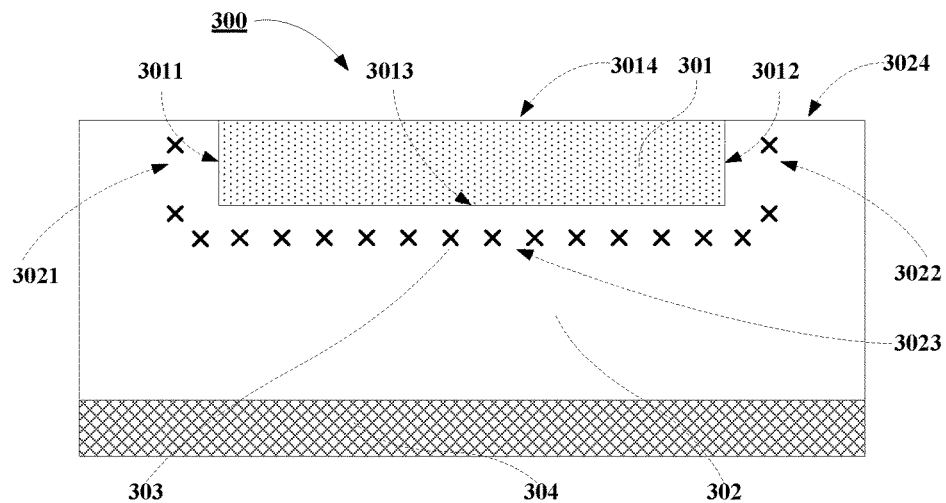
FIG. 3 is a diagram which shows a schematic illustration of a cross-section of a semiconductor device 300 in accordance with an embodiment of the present disclosure.

FIG. 3 is a diagram which shows a schematic illustration of a cross-section of a semiconductor device 300 in accordance with an embodiment of the present disclosure. As shown in FIG. 3, the semiconductor device 300 includes a first semiconductor region 301 which has a first conductivity type (such as p-type, or may be referred to as p-doping) and a second semiconductor region 302 which has a second conductivity type (such as n-type, or may be referred to as n-doping).

As shown in FIG. 3, the first semiconductor region 301 may be configured within the second semiconductor region 302. Furthermore, a plurality of crystal defects 303 are formed in the second semiconductor region 302 and at least part of the first semiconductor region 301 is surrounded by the plurality of crystal defects 303.

For example, a side surface 3011, another side surface 3012 and a lower surface 3013 of the first semiconductor region 301 may be buried in and contact to the second semiconductor region 302; and an upper surface 3014 of the first semiconductor region 301 may be aligned with an upper surface 3024 of the second semiconductor region 302.

For example, the plurality of crystal defects 303 are formed in a side portion 3021, another side portion 3022 and a lower portion 3023 of the second semiconductor region 302. The side portion 3021 contacts to the side surface 3011 of the first semiconductor region 301, the side portion 3022 contacts to the side surface 3012 of the first semiconductor region 301 and the lower portion 3023 contacts to the lower surface 3013 of the first semiconductor region 301.

As shown in FIG. 3, the semiconductor device 300 may further include a substrate 304 on which the second semiconductor region 302 is configured.

As shown in FIG. 3, the concentration (or may be referred to as density) of the crystal defects 303 in the side portion 3021 or 3022 is lower than the concentration of the crystal defects 303 in the lower portion 3023.

For example, a ratio of the concentration of the crystal defects 303 in the side portion 3021 or 3022 to the concentration of the crystal defects 303 in the lower portion 3023 may be from 1:2 to 1:6.

For another example, the ratio of the concentration of the crystal defects 303 in the side portion 3021 or 3022 to the concentration of the crystal defects 303 in the lower portion 3023 may be 1:4.

Furthermore, the concentration of the crystal defects 303 may be, for example, $1E+16 \sim 1E+21/cm^3$. It should be appreciated that the concentration or the ratios are examples of this disclosure, and it is not limited thereto.

Therefore, due to the concentration of the crystal defects in the side portion is lower than the concentration of the crystal defects in the lower portion, a tolerance level of a surge voltage in the longitudinal direction (or may be referred to as positive direction) could be improved. Furthermore, compared to a case with a same concentration of the crystal defects, ON resistance of switching is smaller in this embodiment.

In an embodiment, two or more first semiconductor regions may be configured within the second semiconductor region. For each first semiconductor region, a plurality of crystal defects may be formed in the second semiconductor region and each first semiconductor region is surrounded by the plurality of crystal defects.

Figure 4:
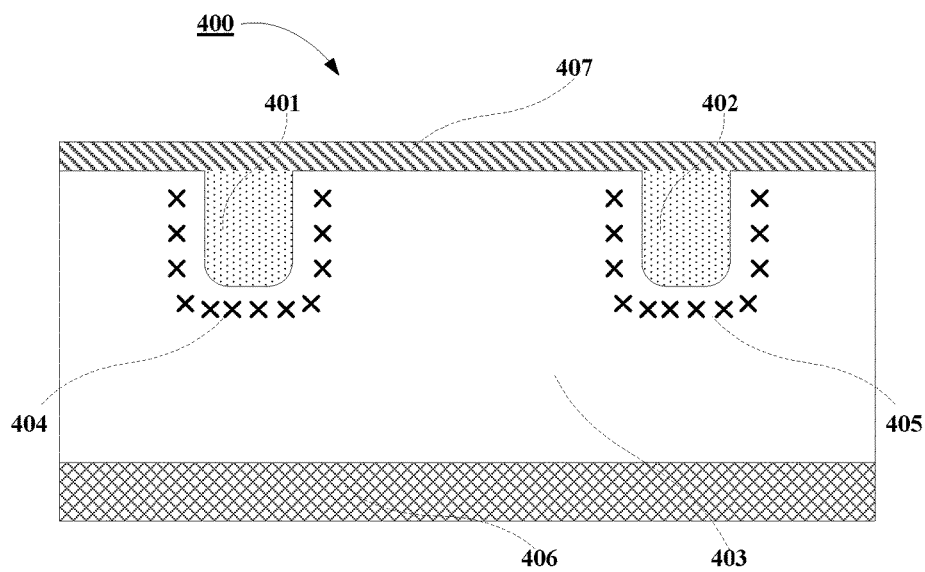
FIG. 4 is a diagram which shows a schematic illustration of a cross-section of a semiconductor device 400 in accordance with an embodiment of the present disclosure.

FIG. 4 is a diagram which shows a schematic illustration of a cross-section of a semiconductor device 400 in accordance with an embodiment of the present disclosure. As shown in FIG. 4, the semiconductor device 400 includes a first semiconductor region 401 which have a first conductivity type (such as p-type, or may be referred to as p-doping), another first semiconductor region 402 which have the first conductivity type and a second semiconductor region 403 which has a second conductivity type (such as n-type, or may be referred to as n-doping).

As shown in FIG. 4, the first semiconductor region 401 and the first semiconductor region 402 may be configured within the second semiconductor region 403. Furthermore, a plurality of crystal defects 404 are formed in the second semiconductor region 403 and at least part of the first semiconductor region 401 is surrounded by the plurality of crystal defects 404; a plurality of crystal defects 405 are formed in the second semiconductor region 403 and at least part of the first semiconductor region 402 is surrounded by the plurality of crystal defects 405.

As shown in FIG. 4, the semiconductor device 400 may further include a substrate 406 on which the second semiconductor region 403 is configured.

Furthermore, the concentration of the crystal defects 404 in the side portion may be lower than the concentration of the crystal defects 404 in the lower portion; the concentration of the crystal defects 405 in the side portion may be lower than the concentration of the crystal defects 405 in the lower portion.

As shown in FIG. 4, the semiconductor device 400 may further include an electrode 407 configured on the first semiconductor region 401, the first semiconductor region 402 and the second semiconductor region 403. For example, the electrode 407 may be Schottky electrode.

It should be appreciated that two of first semiconductor regions are illustrated as examples in FIG. 4, and it is not limited thereto. For example, two or more of first semiconductor regions may be configured according to actual scenarios.

In this embodiment, the semiconductor may be a junction barrier Schottky (JBS) structure or may be a merged PiN/Schottky (MPS) structure. In this embodiment, the holes may be eliminated earlier, therefore, the switching time of the semiconductor device could be further decreased.

It should be appreciated that FIG. 3 and FIG. 4 are only examples, but it is not limited thereto. For example, the structure of the semiconductor device 300 in FIG. 3 may be combined with the structure of the semiconductor device 400 in FIG. 4.

It is to be understood that, the above examples or embodiments are discussed for illustration, rather than limitation. Those skilled in the art would appreciate that there may be many other embodiments or examples within the scope of the present disclosure.

As can be seen from the above embodiments, due to a plurality of crystal defects are formed in the second semiconductor region and at least part of the first semiconductor region is surrounded by the plurality of crystal defects, recombination of charge carriers (electrons and holes) on a lateral direction and a longitudinal direction could be taken into account, and the switching time of the semiconductor device could be adequately decreased.

In addition, due to a concentration of crystal defects in a side portion is lower than the concentration of the crystal defects in a lower portion, a tolerance level of a surge voltage in the longitudinal direction could be improved; and the ON resistance of switching may be smaller.

A Second Aspect of Embodiments

A method for forming a semiconductor device is provided in these embodiments. The semiconductor device is illustrated in the first aspect of embodiments, and the same contents as those in the first aspect of embodiments are omitted.

Figure 5:
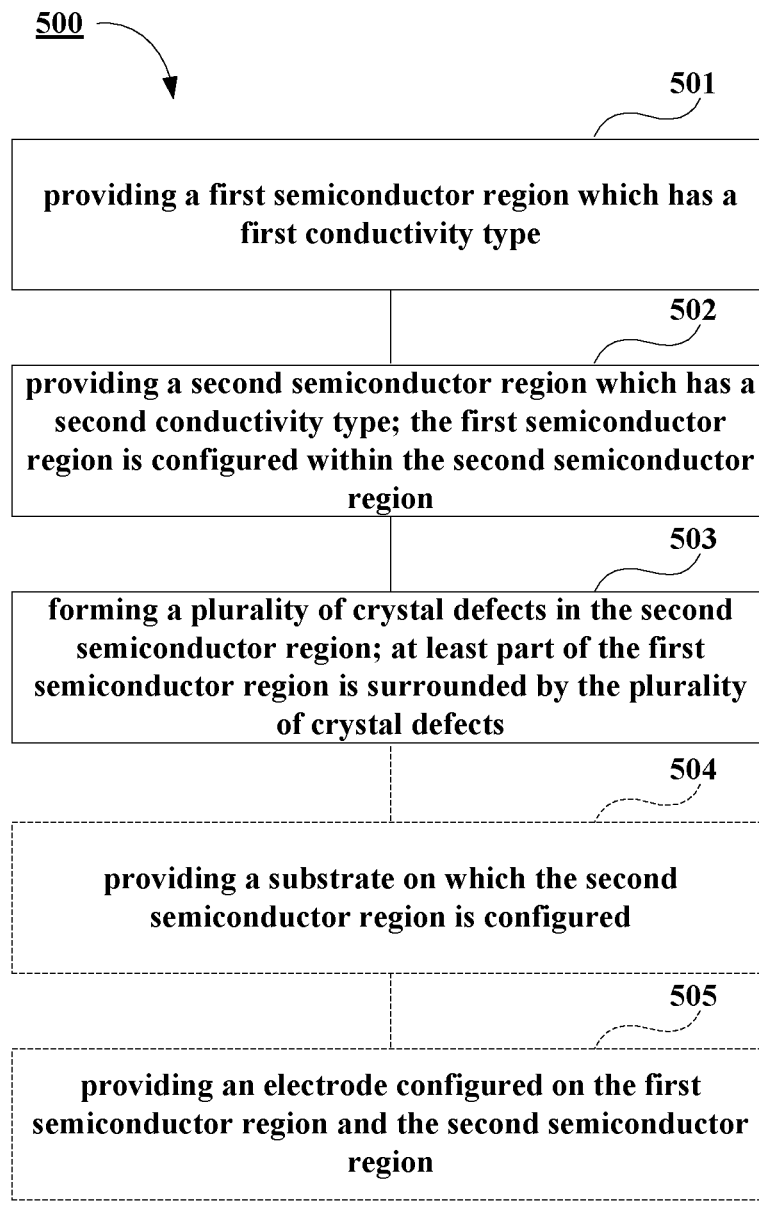
FIG. 5 is a diagram which shows a method 500 for forming a semiconductor device in accordance with an embodiment of the present disclosure.

FIG. 5 is a diagram which shows a method for forming a semiconductor device in accordance with an embodiment of the present disclosure. As shown in FIG. 5, the method 500 includes:

Block 501, providing a first semiconductor region which has a first conductivity type.

Block 502, providing a second semiconductor region which has a second conductivity type; the first semiconductor region is configured within the second semiconductor region.

Block 503, forming a plurality of crystal defects in the second semiconductor region; at least part of the first semiconductor region is surrounded by the plurality of crystal defects.

As shown in FIG. 5, the method 500 may further include:

Block 504, providing a substrate on which the second semiconductor region is configured.

As shown in FIG. 5, the method 500 may further include:

Block 505, providing an electrode configured on the first semiconductor region and the second semiconductor region.

In an embodiment, a concentration of the crystal defects in the side portion is lower than the concentration of the crystal defects in the lower portion.

In an embodiment, two or more first semiconductor regions are configured within the second semiconductor region; and for each first semiconductor region, a plurality of crystal defects may be formed in the second semiconductor region and each first semiconductor region is surrounded by the plurality of crystal defects.

It should be appreciated that FIG. 5 is only an example of the disclosure, but it is not limited thereto. For example, the order of operations at blocks may be adjusted, and/or, some blocks or steps may be omitted. Moreover, some blocks or steps not shown in FIG. 5 may be added.

As can be seen from the above embodiments, due to a plurality of crystal defects are formed in the second semiconductor region and at least part of the first semiconductor region is surrounded by the plurality of crystal defects, recombination of charge carriers (electrons and holes) on a lateral direction and a longitudinal direction could be taken into account, and the switching time of the semiconductor device could be adequately decreased.

In addition, due to a concentration of crystal defects in a side portion is lower than the concentration of the crystal defects in a lower portion, a tolerance level of a surge voltage in the longitudinal direction could be improved; and the ON resistance of switching may be smaller.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device.

While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous.

Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A semiconductor device, comprising:
   a first semiconductor region having a first conductivity type;
   a second semiconductor region having a second conductivity type;
   wherein the first semiconductor region is configured within the second semiconductor region and a plurality of crystal defects are formed in the second semiconductor region and at least part of the first semiconductor region is surrounded by the plurality of crystal defects;
   wherein the plurality of crystal defects are formed in one or more side portions and a lower portion of the second semiconductor region; and a concentration of the crystal defects in one or more of the side portions including crystal defects is lower than the concentration of the crystal defects in the lower portion.

2. The semiconductor device according to the claim 1, wherein the first conductivity type is p-doping and the second conductivity type is n-doping; and a p-n junction is formed between the first semiconductor region and the second semiconductor region.

3. The semiconductor device according to the claim 1, wherein the one or more side portions contact to one or more side surfaces of the first semiconductor region and the lower portion contacts to a lower surface of the first semiconductor region.

4. The semiconductor device according to the claim 1, wherein a ratio of the concentration of the crystal defects in at least one of the side portions to the concentration of the crystal defects in the lower portion is from 1:2 to 1:6.

5. The semiconductor device according to the claim 4, wherein the ratio of the concentration of the crystal defects in at least one of the side portions to the concentration of the crystal defects in the lower portion is 1:4.

6. The semiconductor device according to the claim 1, wherein two or more first semiconductor regions are configured within the second semiconductor region; and
   a plurality of crystal defects are formed for each of the first semiconductor regions in the second semiconductor region and each of the first semiconductor regions is surrounded by the plurality of crystal defects.

7. The semiconductor device according to the claim 1, wherein the semiconductor device further comprises:
   a substrate on which the second semiconductor region is configured.

8. The semiconductor device according to the claim 1, wherein the semiconductor device further comprises:
   an electrode configured on the first semiconductor region and the second semiconductor region.

9. The method according to the claim 1, wherein the one or more side portions contact to one or more side surfaces of the first semiconductor region and the lower portion contacts to a lower surface of the first semiconductor region.

10. The method according to the claim 1, wherein a ratio of the concentration of the crystal defects in at least one of the side portions to the concentration of the crystal defects in the lower portion is from 1:2 to 1:6.

11. The method according to the claim 10, wherein the ratio of the concentration of the crystal defects in at least one of the side portions to the concentration of the crystal defects in the lower portion is 1:4.

12. A method for forming a semiconductor device, comprising:
   providing a first semiconductor region which has a first conductivity type;
   providing a second semiconductor region which has a second conductivity type; wherein the first semiconductor region is configured within the second semiconductor region;
   forming a plurality of crystal defects in the second semiconductor region; wherein at least part of the first semiconductor region is surrounded by the plurality of crystal defects;
   wherein the plurality of crystal defects are formed in one or more side portions and a lower portion of the second semiconductor region; and a concentration of the crystal defects in one or more of the side portions including crystal defects is lower than the concentration of the crystal defects in the lower portion.

13. The method according to the claim 12, wherein the first conductivity type is p-doping and the second conductivity type is n-doping; and a p-n junction is formed between the first semiconductor region and the second semiconductor region.

14. The method according to the claim 12, wherein two or more first semiconductor regions are configured within the second semiconductor region; and
   plurality of crystal defects are formed for each of the first semiconductor regions in the second semiconductor region and each of the first semiconductor regions is surrounded by the plurality of crystal defects.

15. The method according to the claim 12, wherein the method further comprises:
   providing a substrate on which the second semiconductor region is configured.

16. The method according to the claim 12, wherein the method further comprises:
   providing an electrode configured on the first semiconductor region and the second semiconductor region.

* * * * *